(12) United States Patent
Yu et al.

(10) Patent No.: US 12,143,104 B2
(45) Date of Patent: Nov. 12, 2024

(54) COMMUNICATION DEVICE, AND ELECTRONIC DEVICE COMPRISING SAME

(71) Applicant: SAMSUNG ELECTRONICS CO., LTD., Suwon-si (KR)

(72) Inventors: Odo Yu, Suwon-si (KR); Sunghoon Byeon, Suwon-si (KR); Hwasung Kim, Suwon-si (KR); Suho Jo, Suwon-si (KR); Jonghun Ha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/050,934

(22) Filed: Oct. 28, 2022

(65) Prior Publication Data

US 2023/0079319 A1 Mar. 16, 2023

Related U.S. Application Data

(63) Continuation of application No. 17/276,067, filed as application No. PCT/KR2019/011366 on Sep. 4, 2019, now Pat. No. 11,502,689.

(30) Foreign Application Priority Data

Sep. 14, 2018 (KR) .................. 10-2018-0109997

(51) Int. Cl.
*H03K 19/0185* (2006.01)
(52) U.S. Cl.
CPC .............. *H03K 19/018507* (2013.01)
(58) Field of Classification Search
None
See application file for complete search history.

(56) References Cited

U.S. PATENT DOCUMENTS

| | | |
|---|---|---|
| 5,689,196 A | 11/1997 | Schutte |
| 6,781,414 B2 | 8/2004 | Uno |
| 6,954,100 B2 | 10/2005 | Dharne et al. |
| 7,454,535 B2 | 11/2008 | Hwang et al. |
| 7,649,383 B2 | 1/2010 | Kobayashi et al. |
| 7,793,022 B2 | 9/2010 | Travers et al. |
| 9,203,640 B2 | 12/2015 | Xi et al. |
| 11,119,971 B1 | 9/2021 | Singh et al. |

(Continued)

FOREIGN PATENT DOCUMENTS

| | | |
|---|---|---|
| GB | 2349286 B | 3/2001 |
| JP | H-08153056 A | 6/1996 |

(Continued)

OTHER PUBLICATIONS

Korean Intellectual Property Office, "Request for the Submission of an Opinion," issued Dec. 20, 2023, in connection with Korean Patent Application No. 10-2018-0109997, 8 pages.

(Continued)

*Primary Examiner* — Jeffrey S Zweizig

(57) ABSTRACT

A communication device is disclosed. The disclosed communication device comprises: a transmission circuit for generating a transmission signal by using a first field effect transistor (FET) and a signal inputted from a first control circuit, and transmitting the transmission signal to a second control circuit; and a reception circuit for generating a reception signal by using a second field effect transistor (FET) and a signal received from the second control circuit, and outputting the reception signal to the first control circuit.

18 Claims, 12 Drawing Sheets

(56) References Cited

U.S. PATENT DOCUMENTS

| | | |
|---|---|---|
| 2003/0117171 A1 | 6/2003 | Uno |
| 2005/0093512 A1 | 5/2005 | Mader et al. |
| 2005/0176311 A1 | 8/2005 | Lee |
| 2008/0218213 A1 | 9/2008 | Kobayashi et al. |
| 2009/0043926 A1 | 2/2009 | Hwang et al. |
| 2009/0167356 A1 | 7/2009 | Dover et al. |
| 2009/0243695 A1 | 10/2009 | Thoma |
| 2013/0222035 A1 | 8/2013 | David et al. |
| 2015/0341124 A1 | 11/2015 | Lee et al. |

FOREIGN PATENT DOCUMENTS

| | | | |
|---|---|---|---|
| JP | 2003-188706 | A | 7/2003 |
| JP | 2012244493 | A | 12/2012 |
| KR | 20000047242 | A | 7/2000 |
| KR | 20050063397 | A | 6/2005 |
| KR | 20150133968 | A | 12/2015 |
| WO | 03/047106 | A1 | 6/2003 |
| WO | 03048106 | A2 | 6/2003 |

OTHER PUBLICATIONS

International Search Report dated Dec. 20, 2019 in connection with International Patent Application No. PCT/KR2019/011366, 2 pages.

Written Opinion of the International Searching Authority dated Dec. 20, 2019 in connection with International Patent Application No. PCT/KR2019/011366, 6 pages.

European Patent Office "Supplementary Partial European Search Report" issued Sep. 3, 2021, In connection with European Patent Application No. 19859185.1, 11 pages.

European Patent Office, "Supplementary European Search Report" issued Feb. 4, 2022, in connection with European Patent Application No. 19859185.1, 12 pages.

Communication pursuant to Article 94(3) EPC dated Feb. 21, 2024, in connection with European Patent Application No. 19859185.1, 9 pages.

Notice of Allowance issued Sep. 3, 2024, in connection with Korean Patent Application No. 10-2024-0018841, 8 pages.

COMMUNICATION DEVICE, AND ELECTRONIC DEVICE COMPRISING SAME

CROSS REFERENCE TO RELATED APPLICATIONS

This application is a continuation of application Ser. No. 17/276,067 filed Mar. 12, 2021, which is a 371 of International Application No. PCT/KR2019/011366 filed on Sep. 4, 2019, which claims priority to Korean Patent Application No. 10-2018-0109997 filed on Sep. 14, 2018, the disclosures of which are herein incorporated by reference in their entirety.

BACKGROUND

1. Field

The disclosure relates to a communication device and an electronic device comprising the same. More particularly, the disclosure relates to a communication device which transmits and receives a signal by using a field effect transistor (FET) when communicating and an electronic device comprising the same.

2. Description of Related Art

Electronic devices such as an air conditioner, a washer, or the like may perform communication between a plurality of processors included therein by using an asynchronous communication method such as a UART.

Recently, communication has been performed by using a circuit comprised of only a resistance for asynchronous communication and a capacitor, a circuit including a NPN transistor, or a circuit including a PNP transistor.

However, when performing communication using the above-described circuit, because a transmission circuit transmitting a signal to the outside and a reception circuit receiving a signal from the outside cannot be designed to have a symmetrical structure, there is the problem of a high likelihood of an error occurring when designing a circuit, the problem of power being consumed as a result of standby power being generated, the problem of communication between processors with different voltage levels of driving power not being possible, and the problem of having to change a configuration of the circuit to vary the communication speed.

An aspect of the disclosure is in providing an electronic device which transmits and receives a signal by using a field effect transistor (FET) when communicating and an electronic device using the same.

SUMMARY

According to an embodiment of the disclosure, a communication device includes a transmission circuit configured to generate a transmission signal by using a signal input from a first control circuit and a first field effect transistor (FET), and transmit the transmission signal to a second control circuit, and a reception circuit configured to generate a reception signal by using a signal received from the second control circuit and a second field effect transistor (FET), and output the reception signal to the first control circuit.

According to an embodiment of the disclosure, an electronic device includes a sub processor configured to control an operation on a pre-set function of the electronic device, a main processor configured to control the sub processor, and a communication device configured to transfer a control signal of the main processor to the sub processor, and receive a response signal of the sub processor, and the communication device includes a transmission circuit configured to generate a transmission signal by using a control signal input from the main processor and a first field effect transistor (FET), and transmit the transmission signal to the sub processor, and a reception circuit configured to generate a reception signal by using a signal received from the sub processor and a second field effect transistor (FET), and output the reception signal to the main processor.

DETAILED DESCRIPTION

Figure 1:
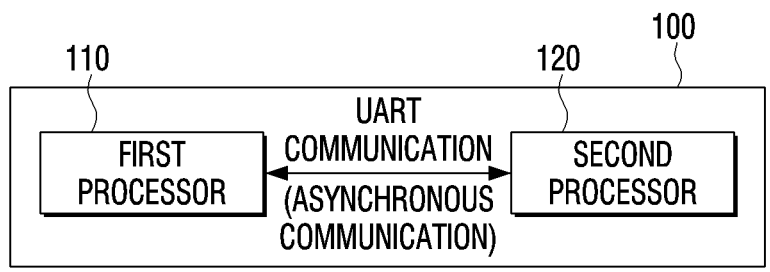
FIG. 1 is a diagram illustrating a UART communication of an electronic device according to an embodiment of the disclosure.

The terms used in the disclosure will be described briefly, and the disclosure will be described in detail.

The terms used in the embodiments of the disclosure are general terms identified in consideration of the functions in the disclosure. However, these terms may vary depending on intention, legal or technical interpretation, emergence of new technologies, and the like of those skilled in the related art. Also, there may be some terms arbitrarily identified by an applicant in certain cases, and in this case the meaning thereof will be described in detail in the description part of the corresponding disclosure. Accordingly, the terms used herein may be construed, not simply by their designations, but based on the meaning of the term and the overall content of the disclosure.

Various modifications may be made to the embodiments of the disclosure, and there may be various types of embodiments. Accordingly, specific embodiments will be illustrated in drawings, and the embodiments will be described in detail in the detailed description. However, it should be noted that the various embodiments are not for limiting the scope of the disclosure to a specific embodiment, but they should be interpreted to include all modifications, equivalents or alternatives of the embodiments included in the ideas and the technical scopes disclosed herein. In describing embodiments, if the detailed description of related known technologies is determined as unnecessarily confusing the gist of the disclosure, the detailed description will be omitted.

Terms such as "first," and "second" may be used in describing the various elements, but the elements are not to be limited by the terms. The terms may be used only to distinguish one element from another.

A singular expression includes a plural expression, unless otherwise specified. It is to be understood that the terms such as "comprise" or "include" are used herein to designate a presence of a characteristic, number, step, operation, element, component, or a combination thereof, and not to preclude a presence or a possibility of adding one or more of other characteristics, numbers, steps, operations, elements, components or a combination thereof.

Embodiments of the disclosure will be described in detail with reference to the accompanying drawings to aid in the understanding of those of ordinary skill in the art. However, the disclosure may be realized in various different forms and it should be noted that the disclosure is not limited to the embodiments described herein. Further, in the drawings, to clearly describe the disclosure, parts not relevant to the description may be omitted.

The disclosure will be described in greater detail below with reference to the accompanying drawings.

FIG. 1 is a diagram illustrating a UART communication of an electronic device according to an embodiment.

Referring to FIG. 1, the electronic device 100 may include a first processor 110 and a second processor 120.

The electronic device 100 may be a device for performing a specific function. For example, the electronic device may correspond to home appliances such as an air conditioner, a washer, a dryer, a refrigerator, and a cleaner but also a smart phone, a tablet PC, a desktop PC, or the like, and is not limited thereto.

The electronic device 100 may perform a unique function according to the type thereof. For example, in the case of a refrigerator, the good accommodated in the storage compartment may be refrigerator stored or freezer stored, and in the case of a washer, contaminants stained on the laundry may be removed by using water and detergent.

Then, the electronic device 100 may include a plurality of processors 110 and 120 to perform the unique function. Specifically, based on the electronic device having a plurality of functions, the plurality of processors 110 and 120 for performing each plurality of functions may be included. For example, based on the electronic device being a refrigerator, the first processor controlling an ice generating device, a second processor controlling a display to display food information, and a main processor controlling the operation of the first processor and the second processor may be included.

The plurality of processors 110 and 120 may perform communication between processors to perform each of the plurality of functions. For example, based on the first processor 110 being the main processor and the second processor 120 controlling the display, the first processor 110 may transfer a control signal to the second processor 120, and the second processor 120 may control an operation of the display based on the received control signal.

Here, the method of communication being performed between the plurality of processors 110 and 120 may correspond to a universal asynchronous receiver/transmitter (UART) communication which is an asynchronous communication, an inter-integrated circuit (I2C) communication, or a serial peripheral interface (SPI) communication, and is not limited to the above-described example.

Meanwhile, in the case of an electronic device 100 corresponding to a home appliance such as an air conditioner or a refrigerator, the communication performed between the plurality of processors 110 and 120 may in general use a UART communication.

The UART communication corresponds to a type of the serial communication, and the transmitter may transmit data of one bit at one time to the receiver. The transmitter may transfer a data packet comprised of consecutive bits, and the receiver may confirm that the data packet has been received through detection of a start bit and a stop bit.

Because the UART communication uses a high signal as a default value, if the high signal is continuously received in the receiver, it may be recognized as there being no transfer of the data packet. On the other hand, based on a low signal being received in the receiver, it may be recognized as a start bit, and it may be recognized that data packet transfer is starting.

Accordingly, the electronic device 100 performing the UART communication may use the communication device designed to transmit and receive the high signal as a default even when there is no data transfer.

According to the related art, a transmission and reception circuit using a circuit comprised only of the resistance and the capacitor to perform the UART communication has been designed, or a transmission and reception circuit using the NPN transistor or the PNP transistor has been designed.

However, in this case, because it was impossible to design the transmission circuit and the reception circuit to have a symmetrical structure, there were problems such as a more complex designing process being necessary when designing the circuit, the NPN transistor being continuously in an on-state and causing the consumption of standby power due to the input signal of the UART communication having a high signal as the default, needing a change of circuits such as the resistance an the capacitor to change the communication speed, or the like.

On the other hand, when designing the transmission and reception circuit performing the UART communication as a circuit including a field effect transistor (FET), designing the transmission circuit and the reception circuit to have a symmetrical structure may be possible, the consumption of standby power may also be prevented, and the communication speed may be changed without the circuit change.

Figure 2:
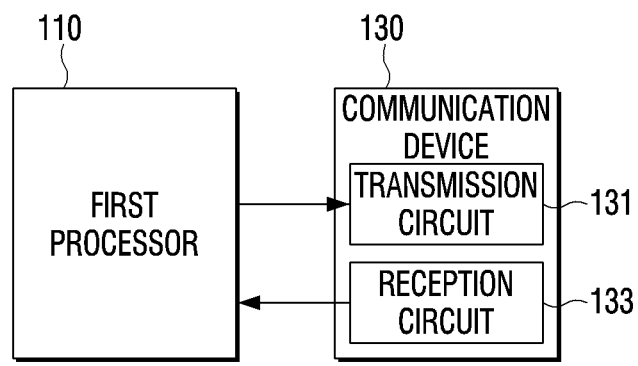
FIG. 2 is a block diagram illustrating a configuration of a communication device according to an embodiment of the disclosure.

FIG. 2 is a block diagram illustrating a configuration of a communication device according to an embodiment of the disclosure.

Referring to FIG. 2, the communication device 130 may include a transmission circuit 131 and a reception circuit 133.

The first processor 110 may generate a signal, transmit the generated signal to the external device (not shown) through the transmission circuit 131 of the communication device 130, and send the response signal received from the external device (not shown) through the reception circuit 133 of the communication device 130.

That is, the communication device 130 may be in charge of the transmitting and receiving of the signal related to the first processor 110.

The transmission circuit 131 may receive input of the control signal from the first processor 110, generate a noise removed output signal which is the same as the control signal input by using the FET, and transmit the generated output signal to the external device (not shown).

Meanwhile, the detailed description on the operation of the transmission circuit 131 transmitting the output signal by using the FET will be described below with reference to FIG. 6.

The reception circuit 133 may receive a signal from the external device (not shown), generate a noise removed output signal which is the same as the signal received by using the FET, and send the generated output signal to the first processor 110.

Meanwhile, the detailed description on the operation of the reception circuit 133 sending the received signal using the FET will be described below with reference to FIG. 6.

Meanwhile, in describing FIG. 2, the communication device has been illustrated and described as a device separate from the first processor, but at implementation, the communication device may be implemented in a method which includes the first processor within.

In addition, in illustrating and describing FIG. 2, the communication device has been illustrated and described as including the transmission circuit and the reception circuit, but at implementation, transmission circuit and the reception circuit may be implemented in a method comprised of a separate device.

In addition, in describing FIG. 2, the transmission circuit 131 and the reception circuit 133 have been described as using the FET to transmit and receive a signal, but at implementation, the at least one circuit only from among the transmission circuit and the reception circuit may be implemented in a method of using the FET to transmit and receive a signal, and the circuit not using the FET may be implemented in a design method of the related art described above.

Figure 3:
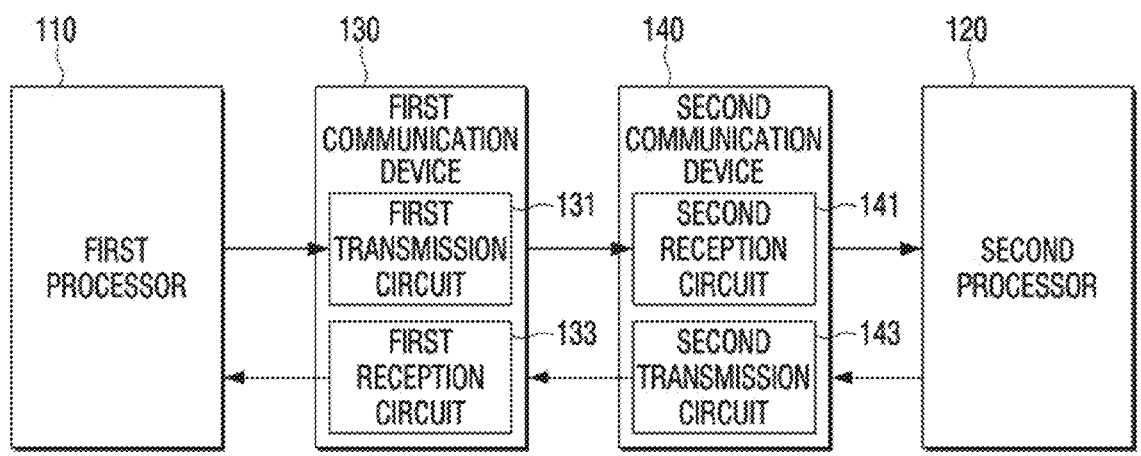
FIG. 3 is a block diagram illustrating a configuration of an electronic device according to an embodiment of the disclosure.

FIG. 3 is a block diagram illustrating a configuration of an electronic device according to an embodiment of the disclosure.

Referring to FIG. 3, the electronic device 100 may include a first processor 110, a second processor 120, a first communication device 130, and a second communication device 140.

The first processor 110 and the second processor 120 may control an operation on a pre-set function from among the plurality of functions of the electronic device 100. For example, if the electronic device 100 is a refrigerator, the first processor 110 or the second processor 120 may be a processor controlling an operation of an external communication device (not shown) which performs communication with an external server or a processor controlling an operation of a display (not shown).

As another example, if the electronic device 100 is an air conditioner, the first processor 110 or the second processor 120 may be a processor controlling an operation of an outdoor fan (not shown) or a processor controlling an operation of a sensor (not shown) which recognizes a speech of a user.

As another example, if the electronic device 100 is a refrigerator, the first processor 110 or the second processor 120 may be a processor controlling an operation of an ice generating device (not shown) or a processor controlling an operation of a display (not shown).

As another example, the first processor 110 or the second processor 120 may be a main processor controlling the processor which controls an operation of the above-described external communication device, the display, the outdoor fan, the sensor, or the like. Meanwhile, the first processor 110 and the second processor 120 are not limited to the above-described examples.

For convenience of description, the first processor 110 may be described below as the main processor controlling the second processor 120, and the second processor 120 may be described below as the processor controlling the display.

Based on the control signal generated by the first processor 110 being input to the first transmission circuit 131, the first transmission circuit 131 may generate a transmission signal by using the FET, and transmit the generated transmission signal to the second reception circuit 141. At this time, the signal output at the output stage of the first transmission circuit 131 may be input to the input stage of the second reception circuit 141 through the cable (line or wire). Then, the second reception circuit 141 may generate a reception signal by using the received transmission signal and the FET, and send the generated reception signal to the second processor 120.

Accordingly, the second processor 120 may control an operation of the display based on the control signal received from the first processor 110.

In addition, based on the response signal generated by the second processor 120 being input to the second transmission circuit 143, the second transmission circuit 143 may generate a transmission signal by using the FET, and transmit the generated transmission signal to the first reception circuit 133. At this time, the signal output from the output stage of the second transmission circuit 143 may be input to the input stage of the first reception circuit 133 through the cable (line or wire). The first reception circuit 133 may generate a reception signal by using the received transmission signal and the FET, and send the generated reception signal to the first processor 110.

Accordingly, the first processor 110 may control the second processor 120 based on the response signal received from the second processor 120.

Meanwhile, the detailed description on an operation of the transmission circuit using the FET to transmit an output signal and an operation of the reception circuit using the FET to send the received signal will be described below with reference to FIG. 6.

Meanwhile, in illustrating and describing FIG. 3, the electronic device has been illustrated and described as including two processors, but at implementation, the embodiment may be implemented as including one or three or more processors.

In addition, in describing FIG. 3, the first processor has been described as the main processor, and the second processor has been described as a processor which controls the display, but at implementation, the first processor and the second processor may be implemented in a method of having a different function from what is described in the above example.

In addition, in illustrating and describing FIG. 3, the first communication device and the second communication device has been illustrated and described as a separate device from the first processor and the second processor, but at implementation, the embodiment may be implemented in a method in which the first communication device is included within the first processor or the second communication device is included within the second processor.

In addition, in illustrating and describing FIG. 3, the first communication device has been illustrated and described as including the first transmission circuit and the first reception circuit, and the second communication device has been illustrated and described as including the second transmission circuit and the second reception circuit, but at implementation, each of the transmission circuit and the reception circuit may be implemented in a method comprised as different devices.

In addition, in describing FIG. 3, each of the transmission circuit and the reception circuit has been described as transmitting and receiving a signal by using the FET, but at implementation, at least one circuit only from among each of the transmission circuit and the reception circuit may be implemented in a method of transmitting and receiving a signal by using the FET, and the circuit not using the FET may be implemented according to a design method of the related art described above.

Figure 4:
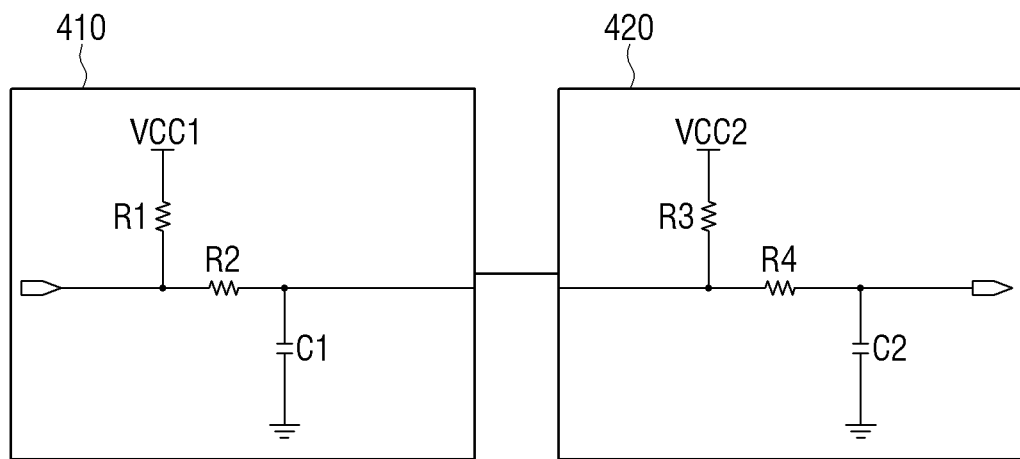
FIG. 4 is a circuit diagram of a communication device configured only with a resistance and a capacitor.

FIG. 4 is a circuit diagram of a communication device configured only with a resistance and a capacitor.

Referring to FIG. 4, the transmission circuit 410 and the reception circuit 420 are examples implemented according to a method of the related art, and here the transmission circuit 410 may correspond to the first transmission circuit 131 or the second transmission circuit 143 of FIG. 3, and the reception circuit 420 may correspond to the first reception circuit 133 or the second reception circuit 141 of FIG. 3.

The transmission circuit 410 may be comprised of a resistance R1 connected to the driving power VCC1 and the input stage, a resistance R2 connected to the input stage and the output stage, and capacitor C1 connected with the output stage and grounded.

In addition, the reception circuit 420 may be comprised of a resistance R3 connecting to the input stage with the driving power VCC2, a resistance R4 connecting to the output stage with the input stage, and capacitor C2 connected with the output stage and grounded.

The transmission circuit and the reception circuit of the related art as described above, may be comprised only of the resistance and the capacitor. When transmitting and receiving a signal by using the above-described transmission and reception circuit, there is the problem of having low immunity with respect to the noise compared to when using a transistor performing a switching function.

In addition, the transmission circuit and the reception circuit of the related art could not be used when the voltage level of the processor inputting the signal to the communication device and the processor receiving the signal from the communication device is different, because of not having a shift function of a voltage level.

In addition, there is the problem of having to change the configuration of the circuit to vary the communication speed. In addition, there is the problem of not being able to design so that the transmission circuit and the reception circuit has a symmetrical structure.

Figure 5:
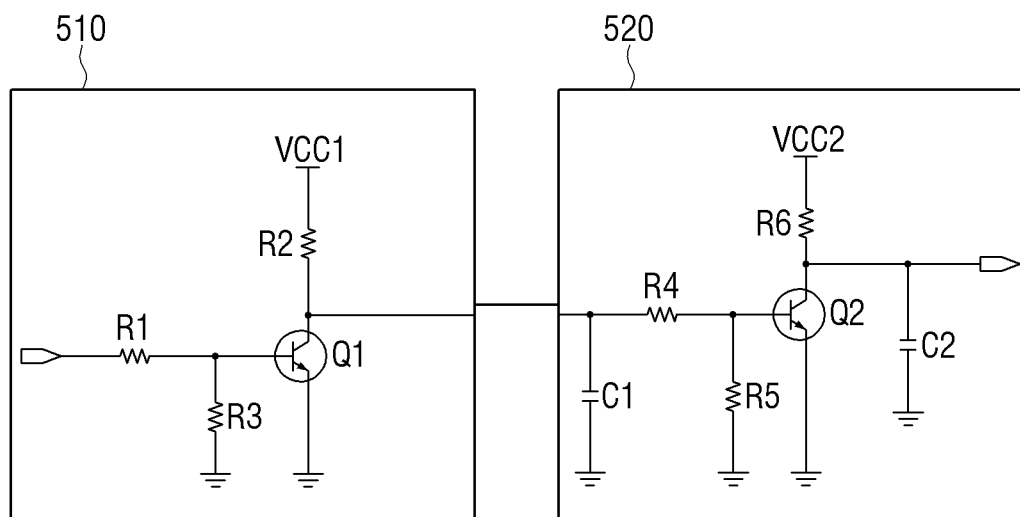
FIG. 5 is a circuit diagram of a communication device including a NPN transistor.

FIG. 5 is a circuit diagram of a communication device including a NPN transistor.

Referring to FIG. 5, the transmission circuit 510 and the reception circuit 520 are other examples implemented according to a method of the related art, and here the transmission circuit 510 may correspond to the first transmission circuit 131 or the second transmission circuit 143 of FIG. 3, and the reception circuit 520 may correspond to the first reception circuit 133 or the second reception circuit 141 of FIG. 3.

The transmission circuit 510 may be comprised of the resistance R1 which is connected to a base of the input stage and the NPN transistor Q1, a resistance R3 which is connected to the base of the NPN transistor Q1 and grounded, the resistance R2 which is connected to the driving power VCC1 and the output stage, and an NPN transistor Q1 in which an emitter is grounded and a collector is connected to the output stage.

In addition, the reception circuit 520 may be comprised of a capacitor C2 which is connected and grounded with the output stage, a resistance R6 which is connected to the output stage and the driving power VCC2, a resistance R5 which is connected and grounded to the base of the NPN transistor Q2, a resistance R4 which is connected to the base and the input stage of the NPN transistor Q2, and the capacitor C1 which is connected and grounded to the input stage.

Based on transmitting and receiving a signal by using the above-described transmission circuit and the reception circuit, there is the advantage of having a high immunity with respect to the noise by using the NPN transistor and a shift of voltage level being possible.

However, the above-described transmission circuit and the reception circuit have the problem of the standby power increasing when the configuration of the circuit is changed to raise the communication speed. In addition, there is the problem of not being able to design so that the transmission circuit and the reception circuit have a symmetrical structure. Meanwhile, the above-described feature may be identically applied even when configuring the transmission and reception circuit by using the PNP transistor.

In addition, the default signal of the UART communication may correspond to the high signal, and there may be the problem of the standby power being consumed as the NPN transistor continuously performs the switch on operation.

To solve the problem of FIGS. 4 and 5 described above, the communication device of the disclosure may perform the transmitting and receiving of a signal by using the FET. The communication device capable of transmitting and receiving a signal by using the FET will be described below with reference to FIG. 6.

Figure 6:
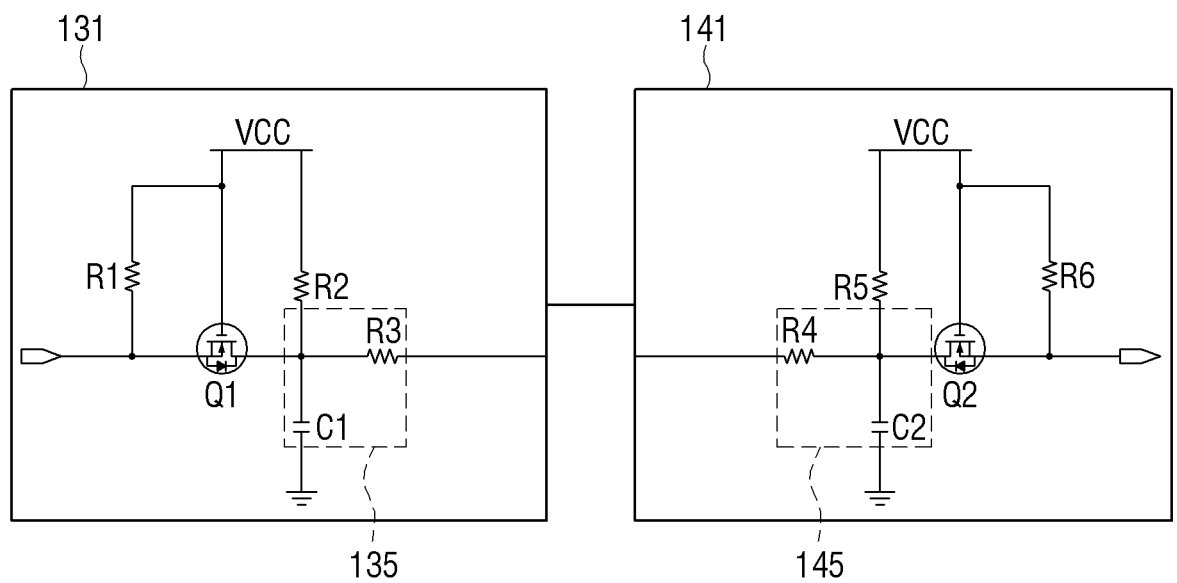
FIG. 6 is a circuit diagram of a transmission circuit and a reception circuit according to a first embodiment.

FIG. 6 is a circuit diagram of a transmission circuit and a reception circuit according to a first embodiment.

Referring to FIG. 6, the first transmission circuit 131 of the first communication device 130 may include a first FET Q1, pull-up resistances R1 and R2 and a first LPF 135. In addition, the second reception circuit 141 of the second communication device 140 may include a second FET Q2, pull-up resistances R5 and R6, and a second LPF 145.

The first communication device 130 and the second communication device 140 may be designed so as to transmit and receive the high signal as a default even when there is no data transfer. This is based on the basic feature of the above-described UART communication.

Then, the operation of the first transmission circuit 131 and the second reception circuit 141 may be varied according to whether the input signal input to the first transmission circuit 131 is a high signal or a low signal.

Below, the operation of the first transmission circuit 131 and the second reception circuit 141 will be described first in case the input signal is the high signal.

First the first FET Q1 may be arranged so that the gate is connected to the driving power VCC and the source is connected to the input stage. Here the first FET Q1 may be a N-Channel Metal Oxide Semiconductor Field Effect Transistor (MOSFET).

In addition, the N-Channel MOSFET may characteristically be on if a difference ($V_{GS}$) of a gate voltage ($V_G$) and a source voltage ($V_S$) is greater than a threshold value, and off if the difference is smaller than the threshold voltage. Accordingly, if a magnitude of the gate voltage ($V_G$) and the source voltage ($V_S$) is the same, because the difference ($V_{GS}$) of the gate voltage and the source voltage is 0, the N-Channel MOSFET may be turned off since it will have a value smaller than the threshold voltage.

According to the characteristic of the above-described N-Channel MOSFET, the first FET Q1 may be turned on and off according to the magnitude of the voltage of the signal input to the input stage and the magnitude of the voltage applied through the gate.

For example, based on the voltage level of the applied signal having a range of 0V~3.3V, the magnitude of the voltage applied form the driving power VCC may be set to 3.3V which is the magnitude of the voltage corresponding to the high signal of the applied signal. At this time, if the signal input through the input stage is 3.3V which is a high signal, because the gate voltage ($V_G$) and the source voltage ($V_S$) is all the same at 3.3V, the first FET Q1 may operate as off.

On the other hand, if the signal input through the input stage is 0V which is a low signal, the difference ($V_{GS}$) of the gate voltage ($V_G$) and the source voltage ($V_S$) may be 3.3V exceeding the threshold voltage magnitude of the related art and the first FET Q1 may operate as on. In addition, even when the voltage level of the applied signal has a range of 0V~5V, by setting the magnitude of the voltage applied to the driving power VCC to 5V, the same method as the method described above may be applied.

Accordingly, based on the high signal being input to the input stage, the first FET Q1 may be operated as off. Then, the floated signal which is generated as the first FET Q1 is turned off may be pulled-up through the driving power VCC and the pull-up resistance R2.

Specifically, if the signal input through the input stage is a high signal, and the voltage applied from the driving power VCC has a voltage magnitude corresponding to the high signal, the first FET Q1 may be off and not output a signal from the first FET Q1.

At this time, a pulled-up signal may be generated to have a value corresponding to the high signal by the power applied from the driving power VCC and the pull-up resistance R2 connected to the driving power VCC.

Then, the pulled-up signal may be output from the first transmission circuit 131, and may be sent to the second reception circuit 141 through the cable (line or wire) which connects the first transmission circuit 131 and the second reception circuit 141. At this time, because the signal output from the first transmission circuit 131 corresponds to the high signal and is the same as the input signal of the first transmission circuit 131, it may have the effect of sending the non-inverted signal to the second reception circuit 141.

Although the sent signal may decrease in voltage magnitude as it passes along the cable and the like, the voltage magnitude may rise again by the driving power VCC of the second reception circuit 141.

The signal which the voltage magnitude has increased again by the driving power VCC may have a voltage magnitude corresponding to the high signal of the signal input to the first transmission circuit 131. Accordingly, the voltage of the signal applied to the drain of the second FET Q2 may have a magnitude corresponding to the high signal.

The voltage may be applied to the gate of the second FET Q2 from the driving power VCC. The voltage of the source of the second FET Q2 may also have a magnitude corresponding to the high signal, and the voltage drop may not be generated.

Specifically, because the first FET Q1 and the second FET Q2 include an internal diode, the voltage of the drain of each FET may have a characteristic of having a magnitude that is greater than or equal to the voltage of the source. Accordingly, if the voltage of the drain of the FET is smaller than the voltage of the source, a voltage drop may be generated from the source side of the FET.

However, in the case of the embodiment, the voltage applied to the drain and source of the second FET Q2 may be the same magnitude corresponding to the high signal, and thus a voltage drop may not be generated.

Because the magnitude of the gate voltage ($V_G$) of the second FET Q2 and the magnitude of the source voltage ($V_S$) of the second FET Q2 are the same, the second FET Q2 may operate as off. Then, the voltage of the source of the second FET Q2 may be maintained at the voltage magnitude corresponding to the high signal.

The high signal generated accordingly may be output through the output stage of the second reception circuit 141 and sent to the second processor 120.

The operation of the first transmission circuit 131 and the second reception circuit 141 in case the input signal is a low signal may be described below.

Based on the low signal being input to the input stage, the first FET Q1 may be operated as on as described above with respect to the operation of the N-Channel MOSFET. Based on the first FET Q1 operating as on, the low signal may be output through the drain of the first FET Q1, and may be output through the output stage of the first transmission circuit 131 passing the first LPF 135.

At this time, because the signal output from the first transmission circuit 131 corresponds to a low signal and is the same as the input signal of the first transmission circuit 131, it may have the effect as sending the non-inverted signal to the second reception circuit 141.

Then, the output signal may be applied to the drain of the second FET Q2 by passing the second LPF 145. Because the low signal is close to 0V, the voltage applied to the drain of the second FET Q2 may also be 0V, and a voltage drop may be generated, in which the voltage of the source of the second FET Q2 is also reduced to 0V according to the characteristic by the diode inside the above-described FET.

At this time, because the driving power VCC applies a voltage corresponding to the high signal to the gate of the second FET Q2, the second FET Q2 may be operated at an on-state. Accordingly, pull-up by the driving power VCC and the pull-up resistance R6 may not be generated, and the voltage of the source of the second FET Q2 may be maintained at a value of 0V.

The low signal generated accordingly may be output through the output stage of the second reception circuit 141 and sent to the second processor 120.

Further, referring to FIG. 6, the first transmission circuit 131 and the second reception circuit 141 may have a symmetrical structure based on the cable (line or wire). Accordingly, the likelihood of an error when designing the communication device may be reduced.

Then, because the pull-up resistances R1, R2, R5 and R6 are able to reduce leakage current by using a resistance of a large magnitude, the power consumption as a result of standby power occurring may be reduced. At this time, the magnitude of the pull-up resistances R1, R2, R5 and R6 may be set arbitrarily by the circuit designer. For example, the pull-up resistances R1, R2, R5 and R6 may have a value of 4.7 KΩ~47 KΩ.

Meanwhile, in illustrating and describing FIG. 6, the first transmission circuit and the second reception circuit have been illustrated and described as transmitting and receiving a signal by using the FET, but at implementation, at least one circuit only from among the first transmission circuit and the second reception circuit may be implemented in a method of transmitting and receiving a signal by using the FET, and the circuit not using the FET may be implemented according to a design method of the related art as described above.

In addition, in illustrating and describing FIG. 6, each of the first transmission circuit and the second reception circuit have been illustrated and described as separate devices, but at implementation, the first transmission circuit and the second reception circuit may be implemented in a method included in one device.

In addition, in illustrating and describing FIG. 6, the first FET and the second FET have been illustrated and described as the N-Channel MOSFET, but at implementation, the embodiment may be implemented in a design method by using the P-Channel MOSFET.

Figure 7:
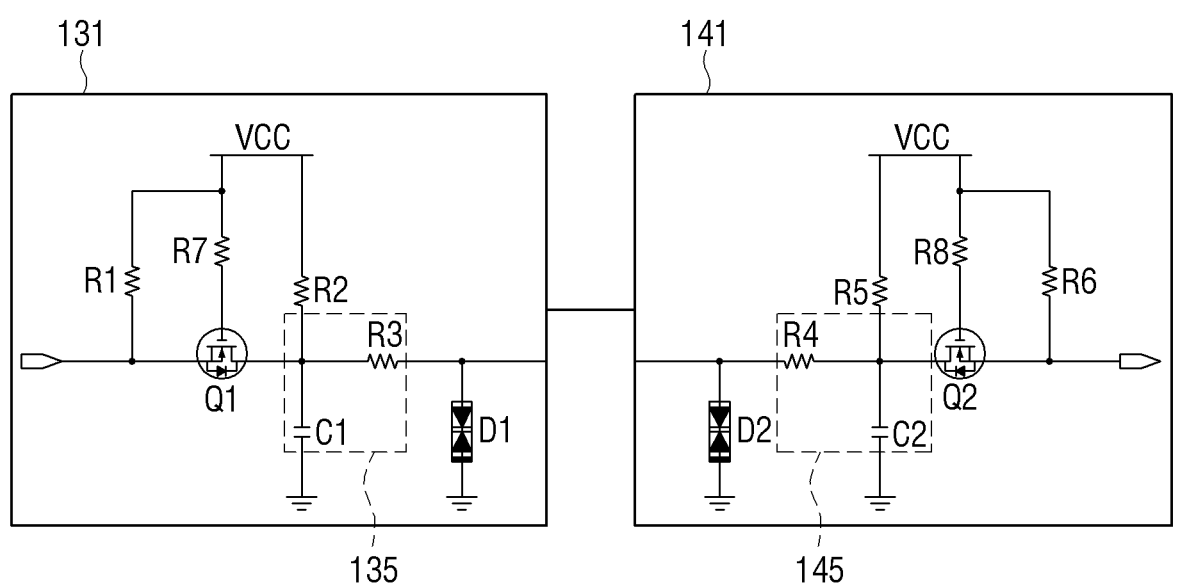
FIG. 7 is a circuit diagram of a transmission circuit and a reception circuit according to a second embodiment.

FIG. 7 is a circuit diagram of a transmission circuit and a reception circuit according to a second embodiment.

Referring to FIG. 7, the first transmission circuit 131 and the second reception circuit 141 may further include resistances R7 and R8 and TVS diodes D1 and D2.

The gate of the first FET Q1 and the resistance R7 connected to the first driving power and the gate of the second FET Q2 and the resistance R8 to be connected to the second driving power may prevent the destruction of element which may be generated by applying a sudden voltage to the gate of each FET.

The TVS diodes D1 and D2 may be connected to the output stage of the first transmission circuit 131 and the input stage of the second reception circuit 141. Then, the TVS diodes D1 and D2 may prevent an electrostatic discharge (ESD) which is temporarily generated by the signal input to each circuit.

Figure 8:
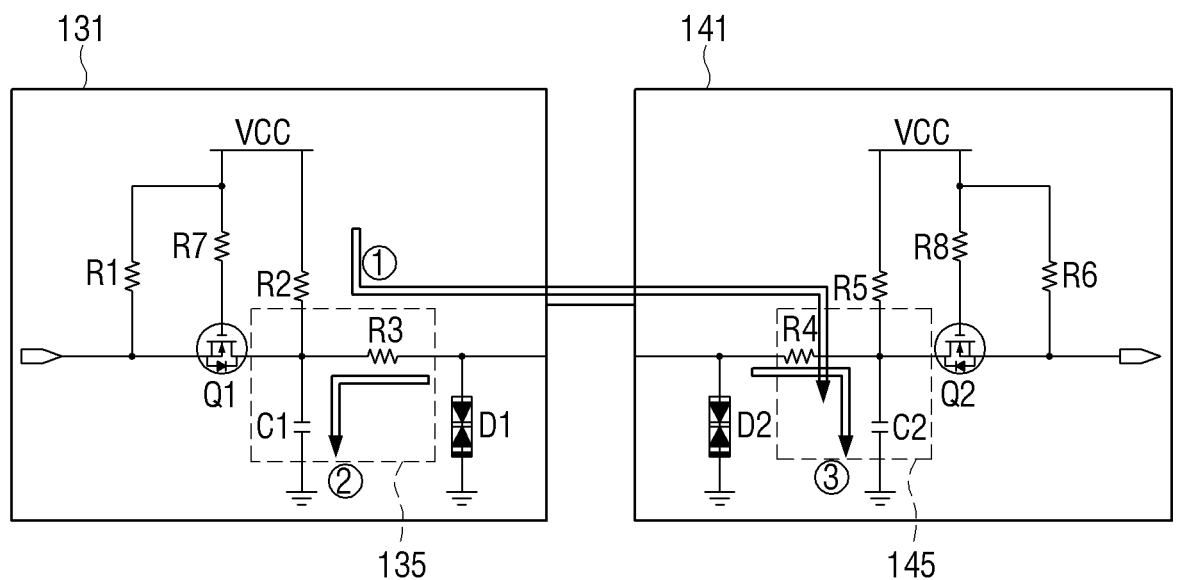
FIG. 8 is a diagram illustrating an operation of a low pass filter (LPF) circuit according to an embodiment.

FIG. 8 is a diagram illustrating an operation of a low pass filter (LPF) circuit according to an embodiment of the disclosure.

Referring to FIG. 8, the first LPF 135 may include the resistance R3 and the capacitor C1, and the second LPF 145 may include the resistance R4 and the capacitor C2.

The first LPF 135 and the second LPF 145 may filter the high frequency component included in the signal input to each thereof. Specifically, the first LPF 135 and the second LPF 145 may block the band having a frequency greater than the cut-off frequency ($f_c$), and the cut-off frequency may be changed according to the magnitude of the resistance comprising the LPF and the capacitance of the capacitor.

Here, the cut-off frequency may be determined based on the communication speed performed in the first communication device 130 and the second communication device 140. Specifically, the cut-off frequency may be determined at a frequency two folds or three folds of the frequency corresponding to the communication speed.

At this time, the UART communication speed may be represented as a bit per second (BPS) referring to the number of bits which may be transferred for one second, and in general, an electronic device may perform communication at a speed of 9600 BPS to 115200 BPS. In addition, the 9600 BPS may correspond to 4800 Hz, and the 115200 BPS may correspond to 57600 Hz.

Accordingly, if the communication speed is 115200 BPS, the frequency corresponding to the communication speed is 57600 Hz, and the cut-off frequency may be determined as 115200 Hz or 172800 Hz, which are frequencies of two folds or three folds of 57600 Hz.

Meanwhile, based on the signal input to the first transmission circuit 131 being a high signal, as the first FET Q1 is operated on a off-state, the voltage may be applied from the driving power. At this time, the high frequency component included in the applied voltage may be filtered through the resistances R2, R3 and R4, and the capacitor C2 as in FIG. 8 ①. Here, because resistances R2 and R3 are series-connected with resistance R4 of second LPF 145, it may operate as a configuration of LPF.

Based on the above-described operation, the resistance value of the resistances R2, R3 and R4 and the capacitor C2 and the capacitance may be determined. For example, when the communication speed is 115200 BPS, the resistance R2 may be designed as 20 KΩ, the resistances R3 and R4 may be designed as 100Ω, and the capacitor C2 may be designed as 0.047 nF. Because the cut-off frequency $f_c$ is $f_c=1/(2\pi \ast R \ast C)$ (wherein R is the resistance value, C is the capacitance), the cut-off frequency in this case is $f_c=1/(2\pi \ast (20\ K\Omega+10\Omega+10\Omega) \ast 0.047\ nF)=167637$ Hz, and because this is a value close to about three folds of the frequency corresponding to the communication speed, it may not correspond to an appropriate design.

In addition, if the signal input to the first transmission circuit 131 is a low signal, the first FET Q1 may operate as on, and the high frequency component included in the low signal may be filtered through the resistances R3 and R4, and the capacitor C2. Here, because the resistance R3 is series-connected with the resistance R4 of the second LPF 145, it may operate as a configuration of LPF.

Meanwhile, the signal output from the output stage of the first transmission circuit 131 may be input to the input stage of the second reception circuit 141 through the cable (line or wire), but the noise may be input to the first transmission circuit 131 or the second reception circuit 141 through the cable (line or wire). Then, the first LPF 135 and the second LPF 145 may filter the input noise.

Specifically, the first LPF 135 may filter the noise input through the output stage of the first transmission circuit 131 by using the resistance R3 and the capacitor C1 as in FIG. 8 ②. In addition, the second LPF 145 may filter the noise input through the input stage of the second reception circuit 141 by using the resistance R4 and the capacitor C2 as in FIG. 8 ③.

Accordingly, the first LPF 135 and the second LPF 145 may filter the high frequency component and noise included in the input signal.

According to the relate art, a transmission and reception circuit comprised only of the resistance and the capacitor, and a transmission and reception circuit has been realized by using the transmission and reception circuit which uses the NPN transistor or the PNP transistor. In the case of the transmission and reception circuit comprised only of the resistance and the capacitor, to vary the communication speed, a circuit change is necessary because a resistance and a capacitor corresponding thereto need to be used.

In addition, in the case of the transmission and reception circuit which uses the NPN transistor or the PNP transistor, a resistance and a capacitance of a small magnitude need to be used for performing high-speed communication, but because the current which is consumed in the transistor is increased, there is the problem of the standby current increasing.

On the other hand, the communication device according to an embodiment as described above may include the transmission and reception circuit using the FET, and because the FET is driven based on the applied voltages, by using the resistance and the capacitance of a small magnitude for high-speed communication, the current to be consumed may increase and the problem of the standby current increasing may be prevented.

Figure 9:
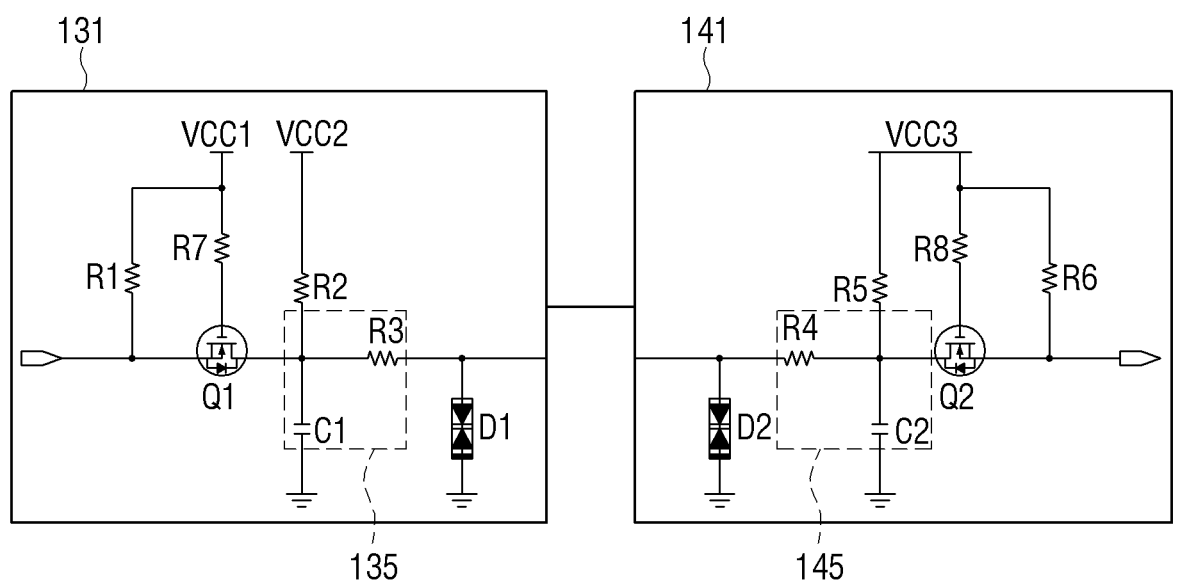
FIG. 9 is a circuit diagram illustrating a level shift according to a first embodiment.

FIG. 9 is a circuit diagram illustrating a level shift according to a first embodiment.

Referring to FIG. 9, the operation of the first transmission circuit 131 and the second reception circuit 141 when the second processor 120 operates at a voltage level greater than the first processor 110 may be confirmed.

The plurality of processors may be provided in the electronic device 100, and each processor may have different voltage levels necessary in the driving thereof.

For example, the first processor 110 may be driven at a voltage level of 0V~3.3V, and the second processor 120 may be driven at a voltage level of 0V~5V. Alternatively, the first processor 110 may be driven at a voltage level of 0V~5V, and the second processor 120 may be driven at a voltage level of 0V~3.3V.

Based on the first processor 110 being driven at a voltage level of 0V~3.3V and the second processor 120 being driven at a voltage level of 0V~5V, a problem may be generated if the signal of the first processor 110 is transmitted as is to the second processor 120.

Specifically, if the 3.3V which is a high signal of the first processor 110 is transmitted as is without the shift of the voltage level, the second processor may have the problem of not being able to clearly recognize whether the received signal is a high signal or a low signal.

In addition, even when the second processor 120 is driven at a voltage level of 0V~3.3V and the first processor 110 is driven at a voltage level of 0V~5V, the same problem may be generated.

Accordingly, if the voltage level necessary in driving each of the first processor 110 and the second processor 120 is different, the above-described problem may be solved by shifting the voltage level with respect to the signal.

The operation of the first transmission circuit 131 and the second reception circuit 141 in case the second processor 120 operates at a voltage level greater than the first processor 110 will be described below. Meanwhile, the detailed description on the operation of the first transmission circuit 131 and the second reception circuit 141 in case the second processor 120 operates at a voltage level smaller than the first processor 110 will be described below with reference to FIG. 10.

In addition, for convenience of description, the first processor 110 has been described as being driven at a voltage level of 0V~3.3V, and the second processor 120 has been described as being driven at a voltage level of 0V~5V.

First, the operation of the first transmission circuit 131 and the second reception circuit 141 incase the input signal is a high signal will be described first.

The voltage (3.3V) corresponding to the high signal of the signal input from the first driving power VCC1 may be applied to the gate of the first FET Q1. Accordingly, based on the signal input to the first transmission circuit 131 being a high signal (3.3V), the first FET Q1 may be off, and the first FET Q1 may operate as on in case the signal input to the first transmission circuit 131 is a low signal (0V).

When the high signal (3.3V) is input at the input stage, the first FET Q1 may operate as off, and the floated signal generated accordingly may be pulled-up through the second driving power VCC2 and the pull-up resistance R2.

At this time, the second driving power VCC2 may apply the voltage (5V) corresponding to the high signal of the voltage level used by the second processor 120. Accordingly, it may be pulled-up to the floated 5V.

The pulled-up signal may be output from the first transmission circuit 131, and sent to the second reception circuit 141 through the cable (line or wire) which connects the first transmission circuit 131 and the second reception circuit 141.

The sent signal may be reduced in voltage magnitude as it passes the cable or the like, but the voltage magnitude may be increased again by the third driving power VCC3.

The signal which the voltage magnitude is increased again by the third driving power VCC3 may have the voltage (5V) corresponding to the high signal of the voltage level used in the second processor 120. Accordingly, the voltage of the signal applied to the drain of the second FET Q2 may also have the voltage (5V) corresponding to the high signal of the voltage level used in the second processor 120.

Then, the voltage (5V) may be applied to the gate of the second FET Q2 from the third driving power VCC3. The voltage of the source of the second FET Q2 may also have the same magnitude, and because the magnitude of the voltage of the drain of the second FET Q2 and the voltage of the source of the second FET Q2 is the same, voltage drop may not be generated.

Because the magnitude of the gate voltage ($V_G$) of the second FET Q2 and the source voltage (VS) of the second FET Q2 is the same, the second FET Q2 may operate as off. Then, the voltage of the source of the second FET Q2 may be maintained at the voltage magnitude corresponding to the high signal of the voltage level used in the second processor 120.

The high signal generated accordingly may be output through the output stage of the second reception circuit 141 and sent to the second processor 120.

The operation of the first transmission circuit 131 and the second reception circuit 141 in case the input signal is a low signal will be described below.

First, when the low signal is input to the input stage, the first FET Q1 may operate as on. Based on the first FET Q1 operating as on, the low signal may be output through the drain of the first FET Q1, and output through the output stage of the first transmission circuit 131 passing the first LPF 135.

Then, the output signal may be applied to the drain of the second FET Q2 passing the second LPF 145. Because the low signal is close to 0V, the voltage applied to the drain of the second FET Q2 may also be 0V, and a voltage drop may be generated in which the voltage of the source of the second FET Q2 is also reduced to 0V according to the characteristics of the internal diode of the above-described FET.

The low signal generated accordingly may be output through the output stage of the second reception circuit 141 and sent to the second processor 120.

That is, the first transmission circuit 131 according to FIG. 9 may generate a non-inverted signal which performed power level shift by using the plurality of driving power and transmit to the second reception circuit 141.

Meanwhile, in illustrating and describing FIG. 9, the first driving power has been illustrated and described as applying a voltage of 3.3V, and the second driving power and the third driving power have been illustrated and described as applying a voltage of 5V, but at implementation, the embodiment may be implemented to have a voltage other than the magnitude of the above-described voltage.

In addition, in illustrating and describing FIG. 9, the first transmission circuit and the second reception circuit has been illustrated and described as transmitting and receiving a signal by using the FET, but at implementation, only the first transmission circuit may be implemented in a method of transmitting and receiving the signal by using the FET, and the circuit not using the FET may be implemented according to a design method of the related art described above.

In addition, in illustrating and describing FIG. 9, each of the first transmission circuit and the second reception circuit have been illustrated and described as separate devices, but at implementation, the first transmission circuit and the second reception circuit may be implemented in a method included in one device.

Figure 10:
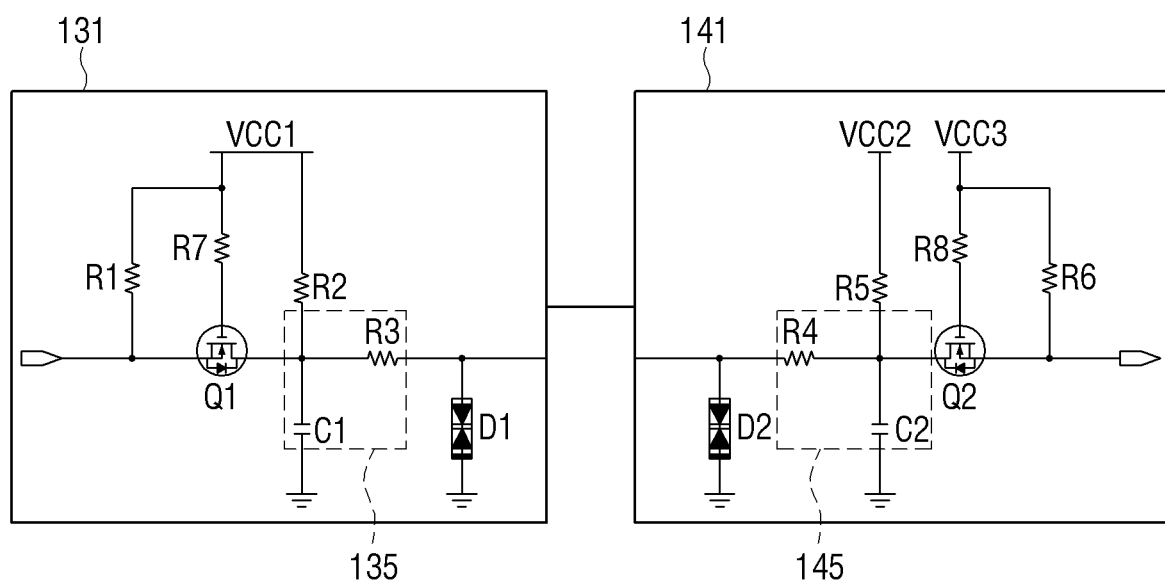
FIG. 10 is a circuit diagram illustrating a level shift according to a second embodiment.

FIG. 10 is a circuit diagram illustrating a level shift according to a second embodiment.

Referring to FIG. 10, the operation of the first transmission circuit 131 and the second reception circuit 141 when the first processor 110 operates at a voltage level greater than the second processor 120 may be configured.

For convenience of description, the first processor 110 has been described as driving at a voltage level of 0V~5V and the second processor 120 has been described as driving at a voltage level of 0V~3.3V below.

First the operation of the first transmission circuit 131 and the second reception circuit 141 in case the input signal is a high signal will be described first.

The gate of the first FET Q1 may be applied with the voltage (5V) corresponding to the high signal of the signal input from the first driving power VCC1. Accordingly, if the signal input to the first transmission circuit 131 is a high signal (5V), the first FET Q1 may be off, and if the signal input to the first transmission circuit 131 is a low signal (0V), the first FET Q1 may operate as on.

Based on the high signal being input to the input stage, the first FET Q1 may operate as off, and the floated signal generated accordingly may be pulled-up through the first driving power VCC1 and the pull-up resistance R2. Accordingly, the floated signal may be pulled-up to the voltage (5V) corresponding to the high signal input to the first transmission circuit 131.

Then, the pulled-up signal may be output from the first transmission circuit 131, and sent to the second reception circuit 141 through the cable (line or wire) which connects the first transmission circuit 131 and the second reception circuit 141.

Then, the sent signal may be reduced as it passes the cable or the like, but the magnitude of the voltage may be increased again by the second driving power VCC2.

The signal of which the voltage magnitude is increased again by the second driving power VCC2 may have the magnitude (5V) of the voltage corresponding to the high signal of the signal input to the first transmission circuit 131. Accordingly, the voltage of the signal applied to the drain of the second FET Q2 may also have the magnitude (5V) of the voltage corresponding to the high signal of the signal input to the first transmission circuit 131.

Then, the voltage (3.3V) corresponding to the high signal of the voltage level used in the second processor 120 may be applied to the gate of the second FET Q2 from the third driving power VCC3. Then, the voltage of the source of the second FET Q2 may also have the same magnitude, and because the voltage (5V) of the drain of the second FET Q2 has a greater value than the voltage (3.3V) of the source of the second FET Q2, the voltage drop may not be generated.

Then, because the magnitude of the gate voltage ($V_G$) of the second FET Q2 and the source voltage ($V_S$) of the second FET Q2 is the same, the second FET Q2 may be operated as off. Then, the voltage of the source of the second FET Q2 may be maintained at the voltage magnitude corresponding to the high signal of the voltage level used in the second processor 120.

The high signal generated accordingly may be output through the output stage of the second reception circuit 141 and sent to the second processor 120.

The operation of the first transmission circuit 131 and the second reception circuit 141 in case the input signal is a low signal will be described below.

First, when the low signal is input to the input stage, the first FET Q1 may be operated as on. Based on the first FET Q1 being operated as on, the low signal may be output through the drain of the first FET Q1, and output through the output stage of the first transmission circuit 131 passing the first LPF 135.

Then, the output signal may be applied to the drain of the second FET Q2 passing the second LPF 145. Because the low signal is close to 0V, the voltage applied to the drain of the second FET Q2 may also be 0V, and the voltage drop in which the voltage of the source of the second FET Q2 also drops to 0V according to the characteristic of the internal diode of the above-described FET may be generated.

The low signal generated accordingly may be output through the output stage of the second reception circuit 141 and sent to the second processor 120.

That is, the second reception circuit 141 according to FIG. 10 may perform the power level shift by using the plurality of driving power, and send to the second processor 120.

Meanwhile, in illustrating and describing FIG. 10, the first driving power and the second driving power has been illustrated and described as applying a voltage of 5V and the third driving power has been illustrated and described as applying a voltage of 3.3V, but at implementation, the embodiment may be implemented to have a voltage other than the magnitude of the above-described voltage.

In addition, in illustrating and describing FIG. 10, the first transmission circuit and the second reception circuit have been illustrated and described as transmitting and receiving a signal by using the FET, but at implementation, only the second reception circuit may be implemented in a method of transmitting and receiving a signal by using the FET, and the circuit not using the FET may be implemented according to a design method of the related art described above.

In addition, in illustrating and describing FIG. 10, each of the first transmission circuit and the second reception circuit have been illustrated and described as separate devices, but at implementation, the first transmission circuit and the second reception circuit may be implemented in a method included in one device.

Figure 11:
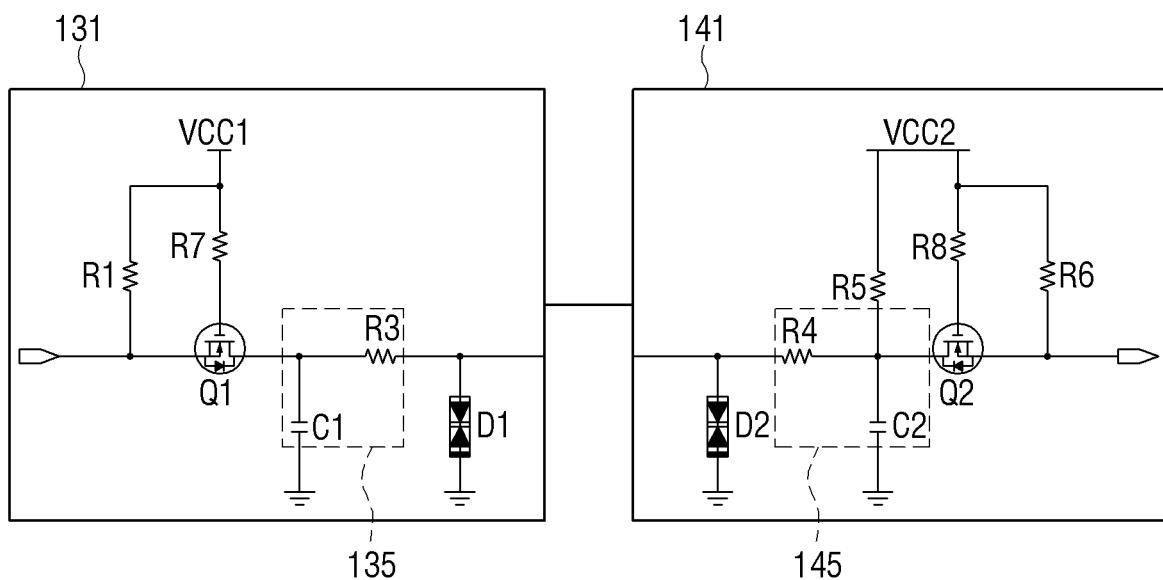
FIG. 11 is a circuit diagram illustrating a level shift according to a third embodiment.

FIG. 11 is a circuit diagram illustrating a level shift according to a third embodiment.

Referring to FIG. 11, the operation of the first transmission circuit 131 and the second reception circuit 141 in case the second processor 120 operates at a voltage level greater than the first processor 110, and the plurality of power cannot be used in the first transmission circuit 131 may be confirmed.

The case of FIGS. 9 and 10 described above assume that the first transmission circuit 131 or the second reception circuit 141 are able to use the plurality of power. However, there may be a case where the first transmission circuit 131 or the second reception circuit 141 is not able to use the plurality of power at an actual implementation due to the type of the electronic device, the limitation of the related components, or the like.

The operation of the first transmission circuit 131 and the second reception circuit 141 in case the first processor 110 operates at a voltage level greater than the second processor 120, yet is not able to use the plurality of power in the first transmission circuit 131 will be described below. In addition, for convenience of description, it has been assumed that the first processor 110 is driven at a voltage level of 0V~3.3V and the second processor 120 is driven at a voltage level of 0V~5V.

First, the operation of the first transmission circuit 131 and the second reception circuit 141 in case the input signal is a high signal will be described first.

The voltage (3.3V) corresponding to the high signal of the signal input from the first driving power VCC1 may be applied to the gate of the first FET Q1. Then, when the high signal is input to the input stage, the first FET Q1 may operate as off.

The floated signal may be generated accordingly, but unlike FIG. 7, because there is no driving power to pull-up the same and no pull-up resistance, the signal may continuously maintain the floating state.

Meanwhile, because the second driving power VCC2 having the voltage (5V) corresponding to the high signal of the voltage level used in the second processor 120 is present in the second reception circuit 141, the voltage of the gate and source of the second FET Q2 may be 5V by the second driving power VCC2, and the voltage of the drain of the second FET Q2 may also be 5V.

Accordingly, the second FET Q2 may be operated as off, and the voltage of the source of the second FET Q2 may be maintained at the voltage (5V) corresponding to the high signal of the voltage level used in the second processor 120.

Accordingly, the high signal is input from the first transmission circuit 131, and despite the floating signal being generated according to the first FET Q1 operating as off, the second reception circuit 141 may recognize as having received the high signal. Even if the floating signal is generated, having designed as if the high signal has been received from the second reception circuit 141 is based on the characteristic of the UART communication which uses the above-described default signal as the high signal.

Meanwhile, because the operation of the first transmission circuit 131 and the second reception circuit 141 in case the input signal is a low signal overlaps with the above-described description in FIG. 9, the description thereof will be omitted.

Meanwhile, in illustrating and describing FIG. 11, the first driving power has been illustrated and described as applying a voltage of 3.3V and the second driving power has been illustrated and described as applying a voltage of 5V, but at implementation, the embodiment may be implemented to have a voltage other than the magnitude of the above-described voltage.

In addition, in illustrating and describing FIG. 11, each of the first transmission circuit and the second reception circuit have been illustrated and described as separate devices, but at implementation, the first transmission circuit and the second reception circuit may be implemented in a method included in one device.

According to the related art, when performing the UART communication by using the transmission and reception circuit which uses the NPN transistor or the PNP transistor, there was the problem of communication between processors using different voltage levels not being possible.

On the other hand, because the communication device according to an embodiment of FIGS. 9 to 11 as described above includes the transmission and reception circuit which uses the FET and the plurality of driving power, communication may also be performed between the processors with different voltage levels.

Figure 12:
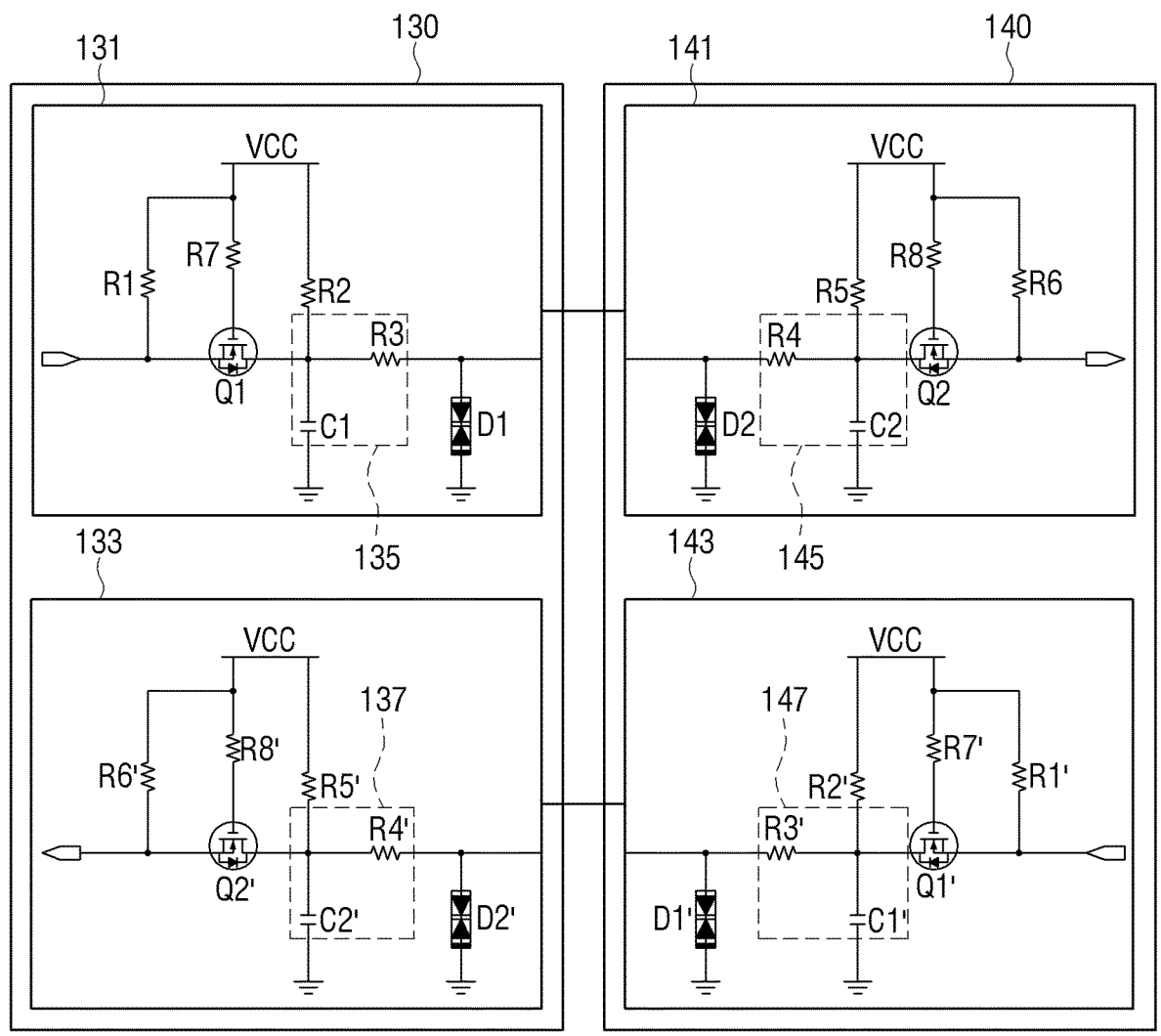
FIG. 12 is an overall circuit diagram of a communication device according to an embodiment.

FIG. 12 is an overall circuit diagram of a communication device according to an embodiment of the disclosure.

Referring to FIG. 12, the first communication device 130 may include the first transmission circuit 131 and the first reception circuit 133, and the second communication device 140 may include the second transmission circuit 143 and the second reception circuit 141.

Because the first transmission circuit 131 and the second reception circuit 141 perform the same function as the configuration of FIG. 7, redundant descriptions thereof will be omitted.

The second transmission circuit 143 may include a third FET Q1', pull-up resistances R1' and R2', and a third LPF 147. In addition, the first reception circuit 133 may include a fourth FET Q2', pull-up resistances R5' and R6', and a fourth LPF 137. That is, the second transmission circuit 143 may have a structure same as the first transmission circuit 131, and the first reception circuit 133 may have the same structure as the second reception circuit 141.

Accordingly, the second transmission circuit 143 may operate substantially the same as the first transmission circuit 131, and the first reception circuit 133 may operate substantially the same as the second reception circuit 141. In addition, in case the voltage level used by each of the first processor 110 and the second processor 120 is different, the same may be applied.

For example, based on the second processor 120 operating at a voltage level of 0V~5V and the first processor 110 operating at a voltage level of 0V~3.3V, the second transmission circuit 143 may correspond to the first transmission circuit 131 of FIG. 10. Accordingly, the seventh driving power VCC7 and the eighth driving power VCC8 of the second transmission circuit 143 may apply the voltage (5V) corresponding to the high signal of the signal input to the second transmission circuit 143.

In addition, the first reception circuit 133 may correspond go the second reception circuit 141 of FIG. 10. Accordingly, the third driving power VCC3 of the first reception circuit 133 may apply a voltage (3.3V) corresponding to the high signal of the voltage level used in the first processor 110, and the fourth driving power VCC4 may apply the voltage (5V) corresponding to the high signal of the signal input to the second transmission circuit 143.

On the other hand, based on the second processor 120 operating at a voltage level of 0V~3.3V and the first processor 110 operating at a voltage level of 0V~5V, the second transmission circuit 143 may correspond to the first transmission circuit 131 of FIG. 9. Accordingly, the seventh driving power VCC7 of the second transmission circuit 143 may apply a voltage (3.3V) corresponding to the high signal of the signal input to the second transmission circuit 143, and the eighth driving power VCC8 may apply a voltage (5V) corresponding to the high signal of the voltage level used in the first processor 110.

In addition, the first reception circuit 133 may correspond to the second reception circuit 141 of FIG. 9. Accordingly, the third driving power VCC3 and the fourth driving power VCC4 of the first reception circuit 133 may apply the voltage (5V) corresponding to the high signal of the voltage level used in the first processor 110.

Accordingly, because the first communication device 130 and the second communication device 140 have a symmetrical structure with each other, the likelihood of an error generating when designing the circuit may be reduced.

While the disclosure has been shown and described with reference to the exemplary embodiments thereof, the disclosure is not limited to the embodiments specifically described and various modifications may be made therein by those skilled in the art to which this disclosure pertains without departing from the spirit and scope of the disclosure, and such modifications shall not be understood as separate from the technical concept or outlook of the disclosure.

What is claimed is:

1. An electronic apparatus comprising:
    a first processor;
    a second processor;
    a first transmission circuit configured to, based on a first signal being input from the first processor, transmit a first transmission signal; and
    a first reception circuit configured to receive the first transmission signal and send a second signal to the second processor;
    wherein the first transmission circuit comprises a first Field Effect Transistor (FET) and a first Low Pass Filter (LPF) circuit and configured to generate the first transmission signal using the first signal and the first FET and transmit the first transmission signal to the first reception circuit;
    wherein the first reception circuit comprises a second FET and a second LPF circuit and configured to receive the first transmission signal, generate the second signal using the first transmission signal and the second FET and send the second signal to the second processor;
    wherein the first transmission circuit and the first reception circuit are connected via a wire;
    a gate of the first FET of the first transmission circuit is connected to a first driving power;
    a drain of the first FET is connected to the first LPF circuit;
    a source of the first FET is connected to the first processor;
    a gate of the second FET of the first reception circuit is connected to a second driving power;
    a drain of the second FET is connected to the second LPF circuit; and
    a source of the second FET is connected to the second processor.

2. The electronic apparatus as claimed in claim 1, wherein a voltage level used by each of the first processor and the second processor is different.

3. The electronic apparatus as claimed in claim 1, wherein a voltage level used by each of the first processor and the second processor is substantially the same.

4. The electronic apparatus as claimed in claim 1, wherein the first transmission circuit and the first reception circuit have a symmetrical configuration based on the wire.

5. The electronic apparatus as claimed in claim 1, wherein the first LPF circuit comprises:
    a first resistance with one end connected to the drain of the first FET and the other end connected to an output of the first transmission circuit; and
    a first capacitor with one end connected to the drain of the first FET and the other end grounded, and
    wherein the first LPF circuit filters high frequency components.

6. The electronic apparatus as claimed in claim 5, wherein the second LPF circuit comprises:
    a second resistance with one end connected to the drain of the second FET and the other end connected to an input of the first reception circuit; and
    a second capacitor with one end connected to the drain of the second FET and the other end grounded, and
    wherein the second LPF circuit filters high frequency components.

7. The electronic apparatus as claimed in claim 6, wherein the output of the first transmission circuit, which is connected to the first resistance, is connected to the wire, wherein the input of the first reception circuit, which is connected to the second resistance, is connected to the wire, and
    wherein a first transmission signal output at the output of the first transmission circuit is input to the input of the second reception circuit through the wire.

8. The electronic apparatus as claimed in claim 1, wherein the first transmission circuit further comprises:
    a third resistance with one end connected to the first processor and the other end connected to the first driving power; and
    a fourth resistance with one end connected to the drain of the first FET and the other end connected to a third driving power.

9. The electronic apparatus as claimed in claim 8, wherein the first transmission circuit is configured to, based on a voltage level of the second processor being higher than a voltage level of the first processor, transmit the first transmission signal to the first reception circuit by level-shifting the first signal input from the first processor by applying a voltage of the third driving power to the drain of the first FET, a voltage level of the third driving power being higher than a voltage level of the first driving power.

10. The electronic apparatus as claimed in claim 1, wherein the first reception circuit comprises:
    a fifth resistance with one end connected to the second processor and the other end connected to the second driving power; and
    a sixth resistance with one end connected to the drain of the second FET and the other end connected to a fourth driving power.

11. The electronic apparatus as claimed in claim 10, wherein the first reception circuit is configured to, based on a voltage level of the second processor being lower than a voltage level of the first processor, transmit the second signal to the second processor by level-shifting the first transmission signal transmitted from the first transmission circuit by applying a voltage of the fourth driving power to the drain of the second FET, a voltage level of the fourth driving power being higher than a voltage level of the second driving power.

12. The electronic apparatus as claimed in claim 1, wherein the first FET and the second FET are N-Channel Metal Oxide Semiconductor Field Effect Transistor (MOSFET).

13. The electronic apparatus as claimed in claim 1, further comprising:
    a second transmission circuit configured to, based on a third signal being input from the second processor, transmit a second transmission signal; and
    a second reception circuit configured to receive the second transmission signal and send a fourth signal to the first processor,
    wherein the second transmission circuit comprises a third FET and configured to generate the second transmission signal using the third signal and the third FET and transmit the second transmission signal to the second reception circuit, and
    wherein the second reception circuit comprises a fourth FET and configured to generate the fourth signal using the second transmission signal and the fourth FET and send the fourth signal to the first processor.

14. The electronic apparatus as claimed in claim 13, wherein the second transmission circuit further comprises a third LPF circuit;
    wherein the second reception circuit further comprises a fourth LPF circuit;

wherein the second transmission circuit and the second reception circuit are connected via a wire, and the second transmission circuit and the second reception circuit have a symmetric configuration based on the wire;
a gate of the third FET of the second transmission circuit is connected to a fifth driving power;
a drain of the third FET is connected to the third LPF circuit;
a source of the third FET is connected to the second processor;
a gate of the fourth FET of the second reception circuit is connected to a sixth driving power;
a drain of the fourth FET is connected to the fourth LPF circuit; and
a source of the fourth FET is connected to the first processor.

15. The electronic apparatus as claimed in claim 14, wherein the third LPF circuit comprises:
a seventh resistance with one end connected to the drain of the third FET and the other end connected to an output of the second transmission circuit; and
a third capacitor with one end connected to the drain of the third FET and the other end grounded, and
wherein the third LPF circuit filters high frequency components.

16. The electronic apparatus as claimed in claim 14, wherein the fourth LPF circuit comprises:
an eighth resistance with one end connected to the drain of the fourth FET and the other end connected to an input of the second reception circuit; and
a fourth capacitor with one end connected to the drain of the fourth FET and the other end grounded, and
wherein the fourth LPF circuit filters high frequency components.

17. The electronic apparatus as claimed in claim 14, wherein the second transmission circuit further comprises:
a ninth resistance with one end connected to the second processor and the other end connected to the fifth driving power; and
a tenth resistance with one end connected to the drain of the third FET and the other end connected to a seventh driving power.

18. The electronic apparatus as claimed in claim 14, wherein the second reception circuit further comprises:
an eleventh resistance with one end connected to the first processor and the other end connected to the sixth driving power; and
a twelfth resistance with one end connected to the drain of the fourth FET and the other end connected to an eighth driving power.

* * * * *